US008365050B2

(12) United States Patent
Snow et al.

(10) Patent No.: US 8,365,050 B2
(45) Date of Patent: Jan. 29, 2013

(54) SYSTEM AND METHOD FOR DECODING A MESSAGE USING A PRIORI INFORMATION

(75) Inventors: Christopher Harris Snow, Kitchener (CA); Ayman Ahmed Mahmoud Abdel-Samad, Waterloo (CA)

(73) Assignee: Research In Motion Limited, Waterloo (CA)

( * ) Notice: Subject to any disclaimer, the term of this patent is extended or adjusted under 35 U.S.C. 154(b) by 504 days.

(21) Appl. No.: 12/614,660

(22) Filed: Nov. 9, 2009

(65) Prior Publication Data
US 2011/0113309 A1    May 12, 2011

(51) Int. Cl.
*H03M 13/00* (2006.01)
(52) U.S. Cl. .......................... 714/780; 375/365; 375/368
(58) Field of Classification Search .................. 714/780; 375/365, 368
See application file for complete search history.

(56) References Cited

U.S. PATENT DOCUMENTS

| | | | |
|---|---|---|---|
| 5,673,291 A | | 9/1997 | Dent |
| 5,768,306 A | * | 6/1998 | Sawahashi et al. ............ 375/150 |
| 6,002,710 A | * | 12/1999 | Hendrickson et al. ........ 375/149 |
| 6,192,500 B1 | | 2/2001 | Yang et al. |
| 6,519,297 B2 | | 2/2003 | Butler et al. |
| 6,950,976 B1 | | 9/2005 | Garrabrant et al. |
| 7,430,241 B2 | | 9/2008 | Vasudevan et al. |
| 7,720,177 B2 | * | 5/2010 | Nee et al. ...................... 375/316 |
| 7,924,950 B2 | * | 4/2011 | Chen et al. .................... 375/341 |
| 7,995,692 B2 | * | 8/2011 | Houcke et al. ................ 375/354 |
| 2007/0230630 A1 | | 10/2007 | Tran |
| 2009/0122921 A1 | | 5/2009 | Chen et al. |
| 2009/0239585 A1 | | 9/2009 | Huss |

FOREIGN PATENT DOCUMENTS

EP    1180852 A1    2/2002

OTHER PUBLICATIONS

Burkert, Frank; Search Report from corresponding EP Application No. 09175425.9; search completed Feb. 19, 2010.

* cited by examiner

*Primary Examiner* — Philip Guyton
(74) *Attorney, Agent, or Firm* — Brett J. Slaney; Blake, Cassels & Graydon LLP

(57) ABSTRACT

Methods and systems are disclosed for decoding digital data received by a correspondent device over a communication channel. The data includes a component corresponding to a plurality of values unknown to the correspondent device and a component corresponding to one or more values known a priori by the correspondent device. To perform decoding, the correspondent device retrieves from memory at least one of the one or more known values. The correspondent device then applies a statistical measure using the known value(s) to estimate the location of the component corresponding to the one or more known values. The one or more known values and the estimated location of the component corresponding to the one or more known values are then used to assist in decoding the data.

24 Claims, 7 Drawing Sheets

SYSTEM AND METHOD FOR DECODING A MESSAGE USING A PRIORI INFORMATION

TECHNICAL FIELD

The following relates generally to decoding messages in a digital communication system.

BACKGROUND

Many digital communication systems employ error control coding to attempt to correct errors in messages that may occur when the message is transmitted over a noisy channel, such as a wireless channel. In general, an encoder at the sender maps the message to a corresponding encoded message. The encoded message is then transmitted across the channel instead of the message. The transmitted message, which may be corrupted by the noise in the channel, is received by the recipient and forwarded to a decoder. The decoder maps the received data to its nearest corresponding message.

Generally, an encoded message can be thought of as the unencoded message with redundancy strategically added. The redundancy is exploited by the decoder to increase the probability of properly decoding the message. Depending on how noisy the channel is (i.e. depending on how many errors are introduced during transmission across the channel), the decoded, message may not correspond to the message that was actually, sent, in which case a decoding error has occurred. Error control codes are well understood, and examples include convolutional codes and linear block codes.

In some applications, further redundancy is added to the message prior to encoding in order to perform error detection in addition to error correction. A typical example is appending a cyclic redundancy check (CRC) code to a message to form a new message, and then encoding this new message using an error control code. The output of the decoder will be a decoded message and a corresponding decoded CRC check code. If the decoded CRC, check code is not the correct CRC check code for the decoded message, then the recipient assumes that message has been decoded in error. In this case, the recipient may request re-transmission of the message.

Often in mobile applications, important control information is transmitted between the in mobile device and a base station. This control information may relate to device setup onto handover between cells for example. It is important that such information be decoded correctly. In some applications, an on-going call may be dropped if such control information is not decoded correctly.

There is a desire to increase the probability of decoding a message correctly.

BRIEF DESCRIPTION

Representative embodiments will now be described by way of example only with reference to the accompanying drawings, in which.

DETAILED DESCRIPTION

Figure 1:
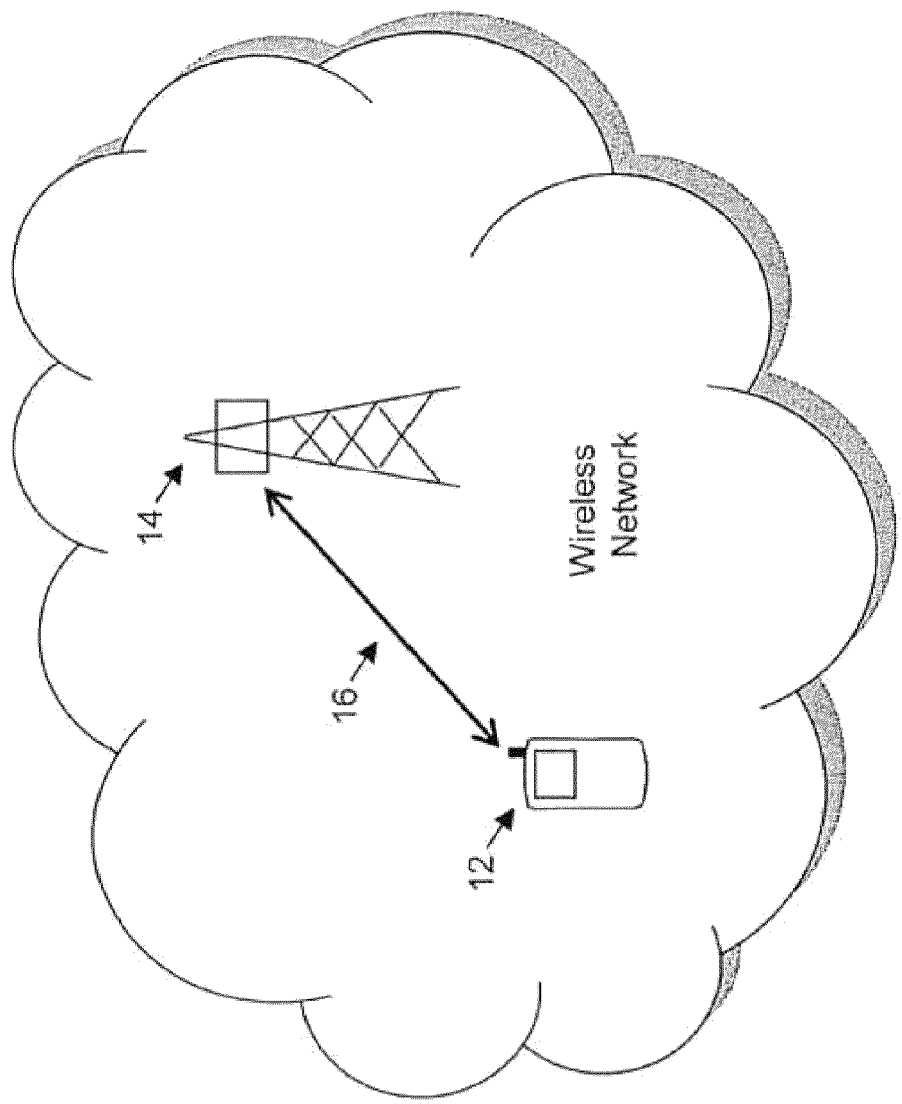
FIG. 1 is a system diagram illustrating a mobile device and a base station.

The following provides a method, a computer readable medium for performing the method, and a mobile device configured for decoding digital data received by a correspondent device over a communication channel, the data including a component corresponding to a plurality of values unknown to the correspondent device and a component corresponding to one or more values known a priori by the correspondent device, at least one of the one or more values known a priori by the correspondent device stored in memory of the correspondent device. In one aspect, the method comprises: (a) the correspondent device retrieving from memory the at least one of the one or more known values; (b) the correspondent device applying a statistical measure using the at least one of the one or more known values to estimate the location of the component corresponding to the one or more known values; and (c) a decoder of the correspondent device using the one or more known values and the estimated location of the component corresponding to the one or more known values in decoding the data.

It will be appreciated that for simplicity and clarity of illustration, where considered appropriate, reference numerals may be repeated among the figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, well-known methods, procedures, and components have not been described in detail so as not to obscure the embodiments described herein. Also, the description is not to be considered as limiting the scope of the embodiments described herein.

It will also be appreciated that that any module, component, or device exemplified herein that executes instructions may include or otherwise have access to computer readable media such as storage media, computer storage media, or data storage devices (removable and/or non-removable) such as, for example, magnetic disks, optical disks, or tape. Computer storage media may include volatile and non-volatile, removable and non-removable media implemented in any method or technology for storage of information, such as computer readable instructions, data structures, program modules, or other data. Examples of computer storage media include. RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by an application, module, or both. Any such computer storage media may be part of the device or accessible or connectable thereto. Any application or module herein; described may be implemented using computer readable/executable instructions that may be stored or otherwise held by such computer readable media.

In general, it has been recognized that for certain digital data received by a correspondent device, the digital data will have a component corresponding to one or more values known a priori by the correspondent device, and that knowledge of these one or more values can be used to improve decoding. It has also been recognized that in some instances the exact location of the component in the received data corresponding to the one or more known values is not known by the correspondent device. In these instances, the correspondent device can apply a statistical measure to estimate the location of the component in the data corresponding to the one or more known values, and then use the known data values and the estimated location to improve decoding.

A first embodiment will now be described with reference to FIGS. 1-5. It will be appreciated that the embodiment described with reference to FIGS. 1-5 is only one example embodiment specific to a particular application. As will be explained below with references to FIGS. 6 and 7, it is contemplated that the method of applying a statistical measure to estimate the location of the component in the received data corresponding to the one or more values known a priori, and then using this estimated location and the known values to assist in decoding, may be generalized to any decoding application in which the transmitted data has, one or more values known a priori by the recipient.

Turning therefore to FIG. 1, there is shown a mobile device 12, which communicates with a base station 14 over a wireless communication channel 16. Examples of applicable mobile devices include pagers, cellular phones, cellular smart-phones, wireless organizers, personal digital assistants, computers, laptops, handheld wireless communication devices, wirelessly enabled notebook computers and the like. In this particular embodiment, the mobile device 12 and the base station 14 communicate according to the Global System for Mobile communications (GSM) standard.

Figure 2:
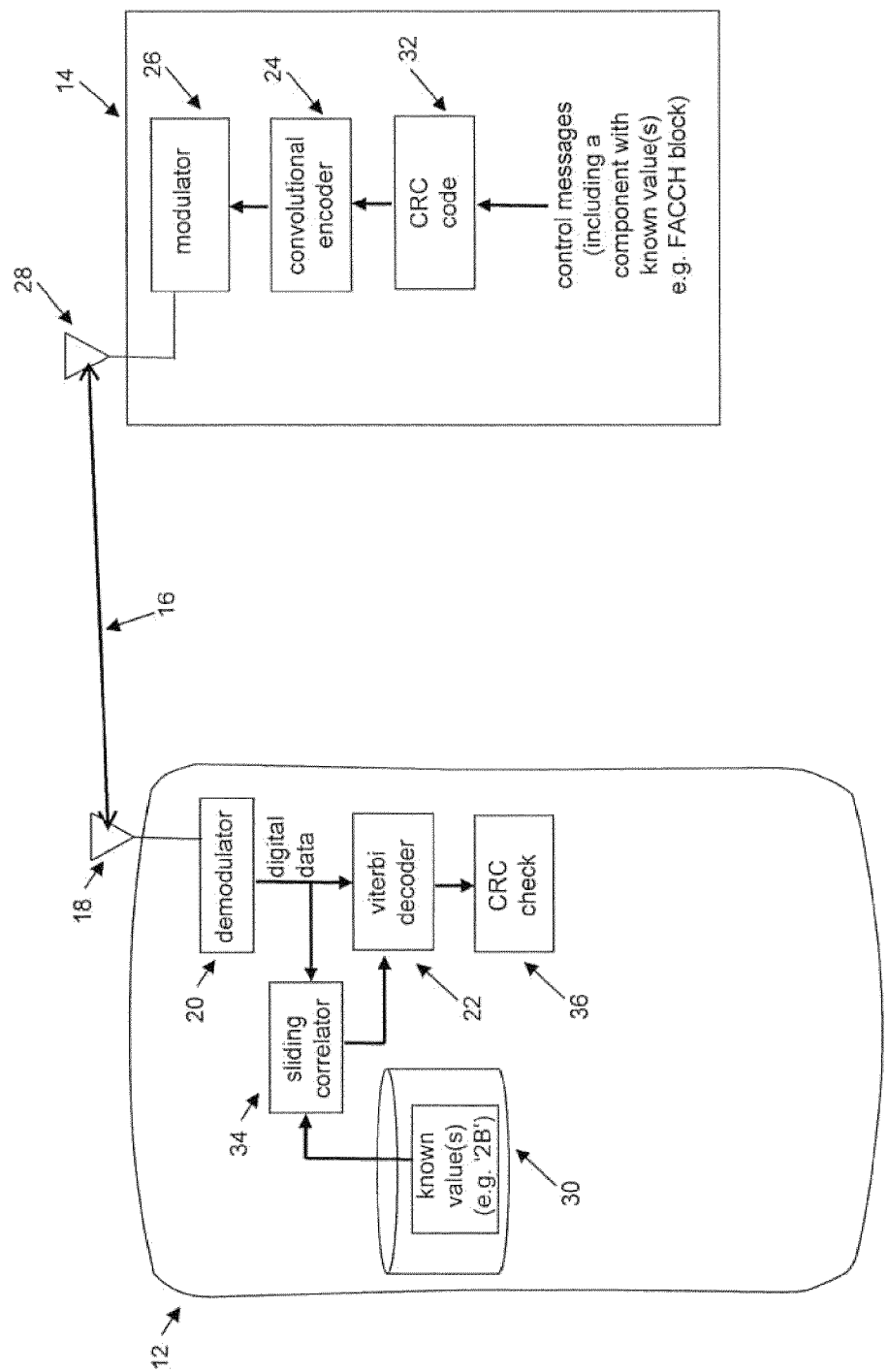
FIG. 2 is a schematic diagram illustrating one embodiment of system components for decoding a message transmitted from the base station to the mobile device.

The mobile device 12 and base station 14 are shown in more detail in FIG. 2. The mobile device 12 comprises at least one, antenna 18 for receiving a radio frequency (RF) carrier having digital data transmitted thereon, a demodulator 20 for demodulating the RF carrier to retrieve the baseband digital data, and a decoder 22 for decoding the data. In this particular embodiment, the decoder 22 is a Viterbi decoder, which is well understood in the art. It will be appreciated that the receiver of the mobile device 12 may include other processing functions besides demodulating and decoding (for example functions relating to digital signal processing). These other functions have been omitted for clarity. It will also be appreciated that the mobile device 12 will also include circuitry for encoding and transmitting digital signals, including an encoder and a modulator. This has also been omitted for clarity, since in this particular example, the mobile device 12 is receiving information transmitted over the communication channel 16 from the base station 14.

The base station 14 comprises an encoder 24 for encoding messages to be transmitted to the mobile device 12, a modulator 26 for modulating the encoded message onto an RE carrier, and at least one antenna 28 for transmitting the RF carrier over the wireless channel 16. In this particular embodiment, the encoder is a convolutional encoder, which is well understood in the art. It will be appreciated that the transmitter of the base station 14 may include other processing functions besides modulating and encoding, but that these functions have been omitted for clarity. It will also be appreciated that the base station 14 will also include circuitry for receiving and decoding, digital signals. This has also been omitted for clarity, since, as mentioned above, in this particular example, the mobile device 12 is receiving information transmitted over the communication channel 16 from the bate station 14.

As the mobile device 12 is utilized during a phone call, periodically during the call the mobile device 12 and the base station 14 must exchange messages relating to control. Such messages may be used to information relating to device setup or to handover between cells, for example. Fast Associated Control Channel (FACCH) blocks and Stand-alone Dedicated Control Channel (SDCCH) blocks are examples of control messages that are transmitted between the base station 14 and the mobile device in the GSM protocol. The length of each FACCH and SDCCH block is fixed by the GSM standard, but the actual number of control data symbols transmitted in these blocks can vary. Therefore, the GSM standard, specifies that the data bits, relating to control go at the beginning of the block, and the remainder of the block be padded with bytes having the value 2B in hexadecimal. Therefore, for example, if the base station 14 transmits to the mobile device 12 a FACCH block, the mobile device 12 will know a priori that a component of the FACCH block could comprise a repeated series of 2B byte padding values. However, the mobile device 12 does not know the exact starting location of this series of padding bytes in the block. As will be explained below, the known value, 2B, is stored in memory 30 on the mobile device 12, and is used to estimate the component of the received data corresponding to the transmitted 2B padding values.

Figure 3:
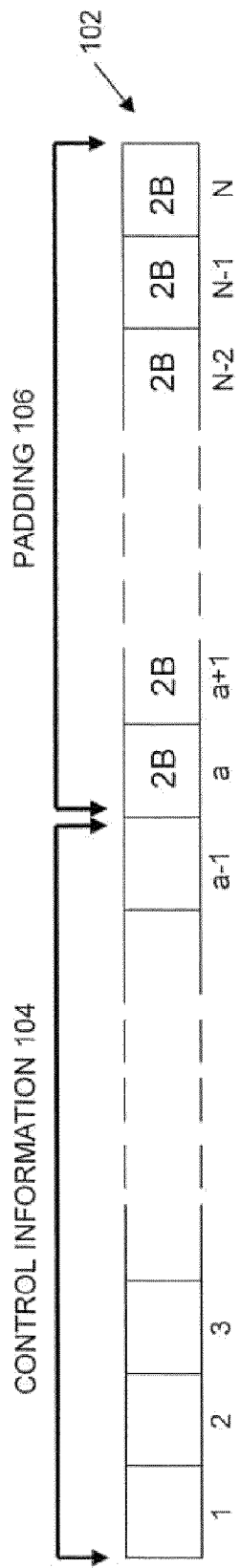
FIG. 3 is an example of a control block that may, be transmitted from the base station to the mobile device.

As an example, consider the transmission of the control block 102 shown in FIG. 3 from the base station 14 to the mobile device 12 of FIG. 2. The control block 102 has a length of N bytes. The amount of control information 104 transmitted in each control block 102 will vary. In general, the control information 104 is transmitted in the first a-1 bytes, and bytes a to N are padded with padding 106 comprising a series of repeating byte values 2B. The mobile device 12 knows a priori the padding byte value 2B, but does not know when the padding begins. That is, the mobile device 12 does not know the value a, which is the location of the first padding byte. The known byte value 2B is stored in memory 30 on the mobile device 12.

Prior to transmitting the control block 102, the base station 12 first calculates a CRC cheek code 32, which is appended to the control block 102 and is used for error detection as known in the art. The control block 102 and appended check code are then forwarded to convolutional encoder 24, which performs convolutional encoding of the block 102 and check code. This encoded sequence is then modulated onto an RF carrier via the modulator 26 and transmitted over the wireless channel 16 via the antenna 28. The wireless channel 16 is typically noisy, which causes errors to be introduced into the encoded sequence. The carrier received by the mobile device 12 is demodulated via the demodulator 20 to obtain baseband digital data symbols comprising the encoded control block 102 and check code having a plurality of errors, for example, introduced by the noise on the wireless channel 16. The Viterbi decoder 22 is responsible for attempting to correct these errors.

Figure 4:
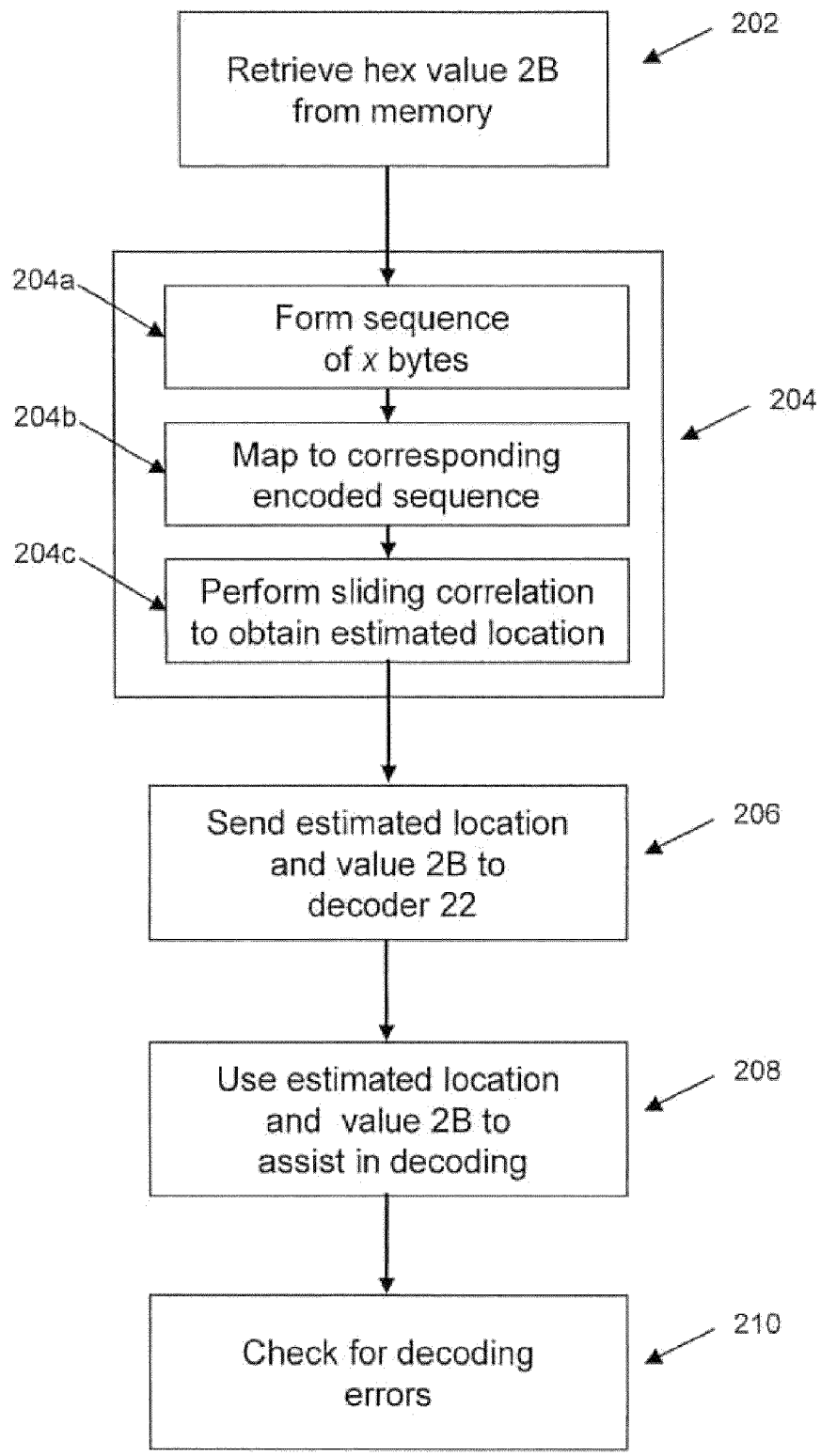
FIG. 4 is a schematic diagram of a set of computer executable instructions for an embodiment of decoding received data.

Advantageously, the known padding 106 can be used by the mobile device 12 to improve the performance of the Viterbi decoder 22. However, the exact starting location of the component of the received data corresponding to the known padding is not known by the mobile device 12. This is because the mobile device 12 only knows a priori the value of transmitted padding bytes, not where the padding begins. Therefore, as shown in the method of FIG. 4, the mobile device 12 advantageously uses a statistical measure to estimate the location of the component of the received digital data corresponding to the padding, and then uses this estimation and the known padding values to improve decoding. As explained earlier, all devices exemplified herein that execute instructions may include or otherwise have access to computer readable media such as storage media, computer storage media, or data storage devices. Therefore, FIG. 4 may comprise a set of computer readable instructions stored on the mobile device 12.

First, in step 202, the mobile device 12 retrieves known byte 2B from its memory 30. Next, in step 204, the mobile device 12 applies a statistical measure using the known byte 2B to estimate the location of the component of the received data corresponding to the known padding. In this embodiment, the statistical measure comprises a sliding correlation using a sliding correlator 34.

Step 204 comprises the following substeps. In substep 204a, the known byte 2B is repeated to form a sequence of x bytes, e.g. 2B 2B 2B . . . 2B. Then, in substep 204b, this sequence is mapped to its corresponding encoded sequence. Alternatively, the corresponding encoded sequence could be the known values stored in memory 30 and instead retrieved in step 202. In step 204c, the corresponding encoded sequence is then used by the sliding correlator 34 to search for the beginning of the component in the received digital data corresponding to the encoded padding bytes. The sliding correlator 34 performs sliding correlation to estimate the most likely starting location of the component. The sliding correlation is performed by the sliding correlator 34 as follows: beginning at the start of the received digital data block and moving towards the end of the digital data block, at each location the encoded sequence of x padding bytes is multiplied bit by bit with a sequence of corresponding bits in the received digital data. The multiplied values are then summed to obtain a measure of correlation. The higher the measured correlation value, the more likely the sequence of corresponding bits in the received digital data corresponds to the padding values. It will be appreciated that the multiplication may comprise an XOR operation.

Figure 5:
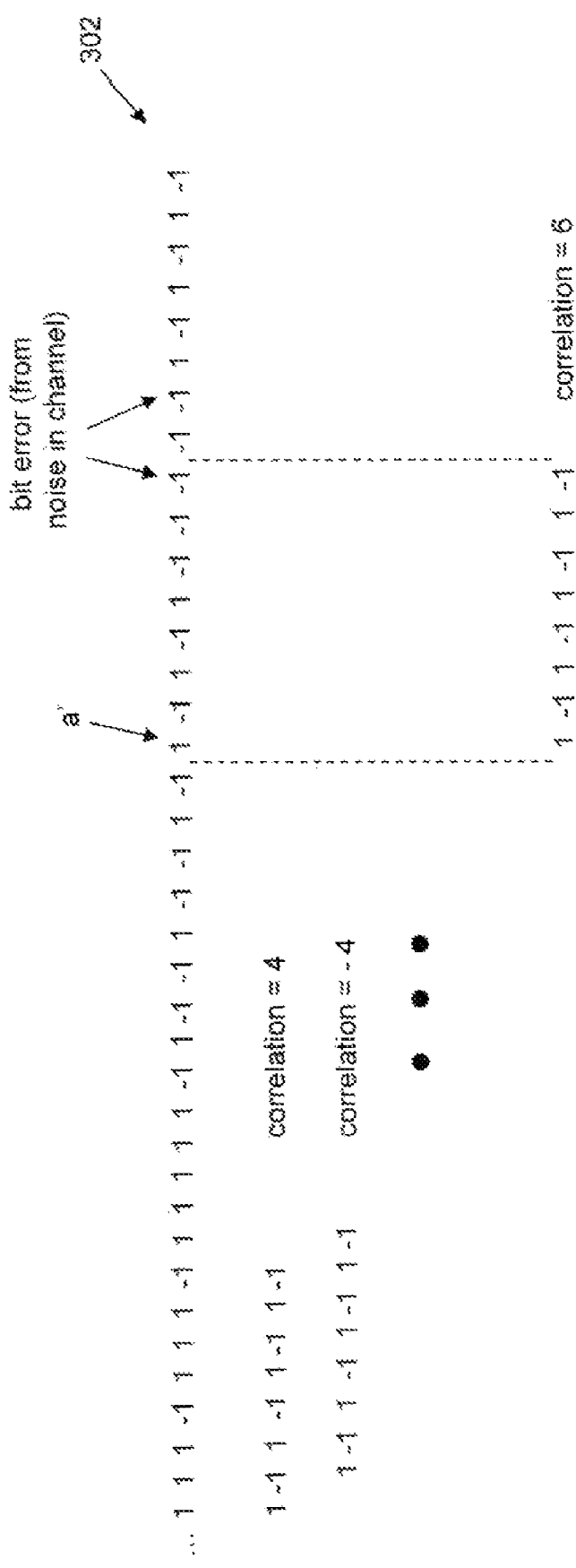
FIG. 5 illustrates an example of performing sliding correlation.

Sliding correlation in general is a mathematical technique known in the art. However, for completeness, an example is provided in FIG. 5 to illustrate an embodiment of a sliding correlation operation. A portion of a received data stream is shown by reference character 302. The data stream is represented as bits mapped to a symbol space in which the binary bit '1' is represented by a '1' and the binary bit '0' is represented by a '−1'. Let it be assumed that the last 16 bits correspond to the encoded padding symbols with errors from the transmission over the noisy channel. Let it also be assumed that the encoded sequence corresponding to the x known bytes from the memory 30 is represented by the hit sequence 1 −1 1 −1 1−1 1−1. In this example, x equals one. The sliding correlator 34 therefore starts at the beginning of data stream 304 and moves towards the end of the data stream one bit at a time. For each window position, a correlation value is calculated by multiplying bit-by-bit the known bit sequence with the corresponding data bits in the window and then summing the result of each multiplication. Each correlation value is stored, for example in the memory 30. As shown in FIG. 5, when the window reaches the first eight bits of the encoded padding symbols at location a', the correlation value is measured as six. Assuming this is the highest correlation value calculated, then a' will be the estimated starting location of the component of the data corresponding to the padding. In this embodiment, the ending location of the component corresponding to the padding is known a priori by the mobile device 12 since the padding continues to the end of the control block.

As can be appreciated, the length x of known bytes offers, a tradeoff between false detection and missed detection: if x is too large, then it may be harder to distinguish the exact location of the component of the data corresponding to the padding, whereas if x is too short, then the sliding correlator 34 will have a higher probability of identifying the wrong location as the estimated starting location.

It will be appreciated that FIG. 5 is a simplified example to demonstrate the concept of sliding correlation. Sliding correlation may comprise hard sliding correlation (a simplified example of which is shown in FIG. 5) or it may comprise soft correlation (wherein, generally speaking, values have a confidence measure which is taken into account in the correlation calculation).

The sliding correlator 34 can perform sliding correlation in real-time as the digital data is received, or once the complete transmitted control block has been received and is stored in memory. In one embodiment, the sliding correlator 34 performs sliding correlation in real-time, and as the data is received it measures each calculated correlation value against a threshold. If for a given position the calculated correlation value is greater than that threshold, then the sliding correlator 34 assumes that that position is the starting; location of the component in the received data corresponding to the known values. For example, in the example of FIG. 5 the threshold value could be five, thereby identifying a' as the starting location of the component since the correlation value at a' (six) is greater than the threshold (five).

It will be appreciated that the choice of the threshold value offers a trade off between probability of missed detection and probability of identifying the wrong location as the estimated starting location.

In another embodiment, the sliding correlator 34 waits until the transmitted control block has been received. It then calculates the correlation value for every window position and takes the position having the highest correlation value as the starting location of the component in the received data corresponding to the known values. Generally speaking, this will provide, a more accurate estimate of the starting location compared to performing sliding correlation in real time, but will increase the delay at the transmitter.

Returning back to FIG. 4, once the estimated location of the component in the received data sequence corresponding to the encoded padding bytes is calculated, then in step 206 this estimated location and the known value 2B is forwarded to the Viterbi decoder 22. In step 208, the decoder 22 uses this information to assist in decoding. This can be done a number of different ways. For example, in one embodiment the decoder 22 assumes the estimated location of the component is the actual location of the component. Then, prior to executing the decoding algorithm, the decoder 22 first deletes the received data component corresponding to the encoded padding values (which has errors introduced from the noisy channel), and replaces this component with the actual encoded padding values, thereby eliminating any bit errors that were introduced into this component. In another embodiment, the decoder 22 first performs Viterbi decoding on the received data, and then replaces the decoded padding with the series of known 2B byte values, thereby eliminating any decoding errors in the padding. In yet another embodiment, the decoder 22 decodes the data component corresponding to the unknown values using the Viterbi decoding algorithm, but advantageously uses the known-values and the estimated location to set the correct starting or ending state in the Viterbi algorithm. Such a technique is disclosed in the co-owner's U.S. Patent Application Publication No. 2007/0230630, the contents of which are incorporated herein by reference. The technique in U.S. Patent Application Publication No. 2007/0230630 assumes the Viterbi decoder knows the exact location of the padding. The decoder 22 can therefore use the technique in U.S. Patent Application Publication No 2007/0230630 by assuming the estimated location calculated iii step 204 is the exact location. In yet another embodiment, the decoder 22 first performs Viterbi decoding on the received data, then the CRC check 36 is performed on the decoded message. If the CRC check 36 indicates that there are errors in the decoded message, the decoder 22 deletes the received data component corresponding to the encoded padding values, and replaces this component with the actual encoded padding values, thereby eliminating any bit errors that were introduced into this component. The decoder 22 then performs the Viterbi decoding a second time, with the modified received data.

Next, in step 210, the decoder 22 outputs the decoded control block 102 and its corresponding CRC check code. These decoded values, are forwarded to the CRC check module 36 to perform a CRC check to try and detect decoding errors, as is known in the art.

As described above, the sliding correlator 34 can choose, as the estimated location, the location having a correlation value above a given threshold or the location having the calculated correlation value. In a variation of this embodiment, the sliding correlator 34 stores in the memory 30 another possible starting location of the component in the data corresponding to the encoded padding values. For example, this might be a location that yields the second-highest correlation measure. Then, if the CRC check module 36 detects a decoding error, steps 206 to 210 are repeated using another possible location as the estimated location. If desired, the sliding correlator 34 could tank a plurality of other possible locations and iteratively repeat steps 206 to 210 using each of the other possible locations as the estimated location until the CRC check indicates no decoding errors. The number of iterations would depend on the amount of delay tolerable and the computational resources available.

It will be appreciated that the embodiments described with reference to FIGS. 1 to 5 are specific to a particular application. As will be recognized, the method of applying a statistical measure to estimate the location of a component in the received data corresponding to one or more values known a priori, and then using this estimated location and the known values to assist in decoding, may be generalized to any decoding application in which the transmitted data has one or more values known a prior by the recipient. To this end, an example embodiment is described with respect to FIGS. 6 and 7.

Figure 6:
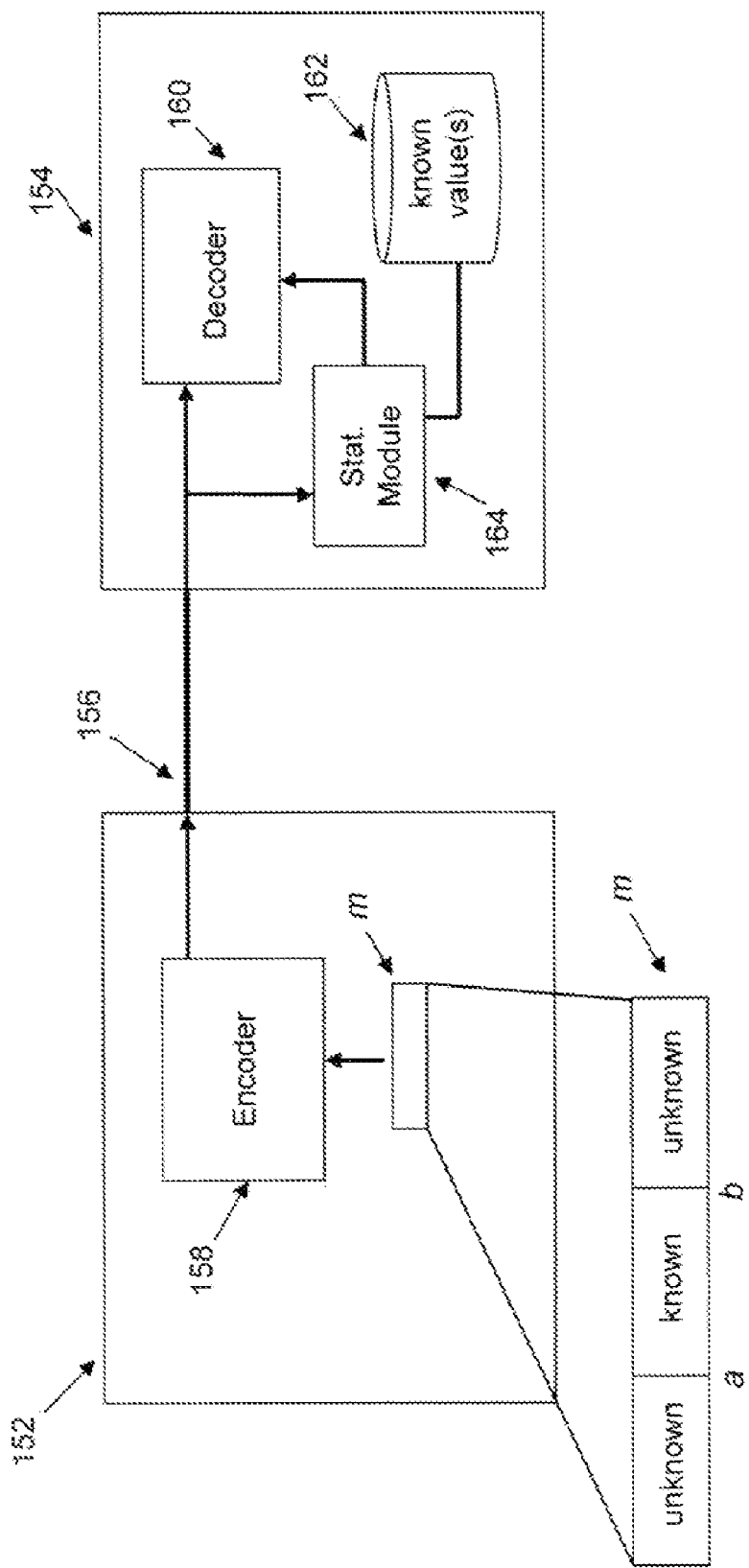
FIG. 6 is a schematic diagram illustrating an embodiment of system components for decoding a message transmitted from one correspondent device to another correspondent device.

Turning first to FIG. 6, there is shown a first correspondent device 152, which communicates with a second correspondent device 154 over a noisy communication channel 156. As an example, the communication channel may be a wireless communication link or a cable. The first and second correspondent devices 152, 154 are each devices that can send and receive digital messages, and each device may be, for example, a mobile device or a stationary device (such as a computer or a communication station).

The first correspondent device 152 has a digital message m that it wishes to encode and transmit to the second correspondent device 154. To achieve this, as shown in FIG. 6, the first correspondent device 152 includes an encoder 158. The second correspondent device 154 therefore includes a corresponding decoder 160 to decode the encoded message m.

The message m includes a plurality of values unknown to the second correspondent device 152 and one or more values known a priori by the second correspondent device 154. However, the exact starting and ending data symbols a and b of the sequence of the known values is not known to the second correspondent'device 154.

In general, the message m may actually include several sequences of one or more known values separated by unknown values, with each sequence having an unknown starting and ending location. However, for simplicity, the message m transmitted in FIG. 6 comprises a single series of one or more known values bounded by starting and ending locations a and b respectively.

In use, the first correspondent device 152 encodes the message m using encoder 158 and transmits this over the channel 156. The channel 156 is noisy and therefore introduces bit errors into the encoded message. The digital data received by the second correspondent device 154 therefore has a component corresponding to the plurality of values unknown to the second correspondent device 154 and a component corresponding to the one or more values known a priori by the second correspondent device 154. However, the exact location of the component corresponding to the one or more values known a priori is not known to the second correspondent device 154.

The second correspondent device 154 includes a memory 162 having stored thereon at least one of the one or more values known a priori.

Figure 7:
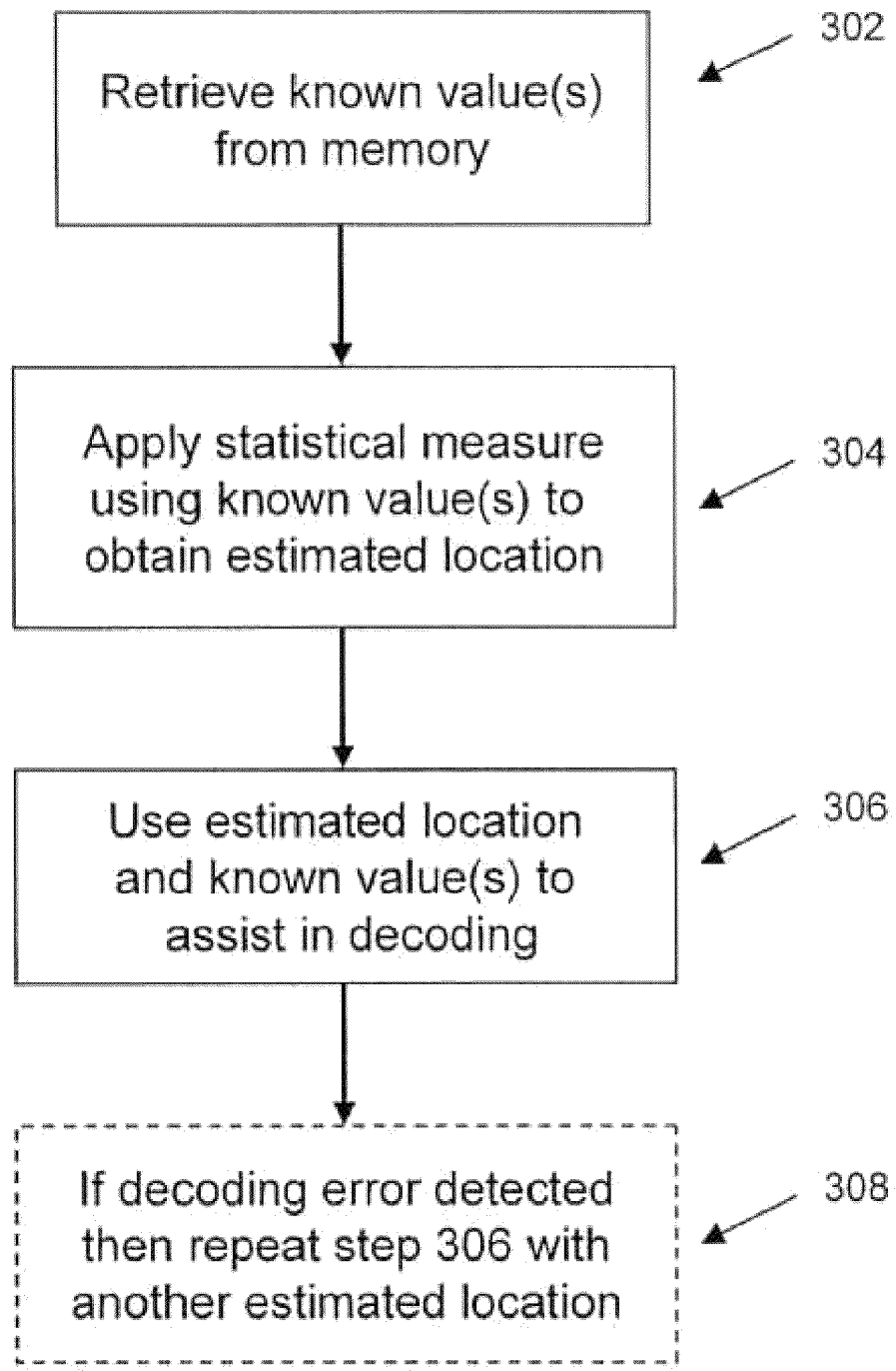
FIG. 7 is a system diagram of another set of computer executable instructions for an embodiment of decoding received data.

As will be described with reference to FIG. 7, advantageously, the second correspondent device 154 uses a statistical module 164 to, apply a statistical measure to estimate the location of the component corresponding to the one or more known values and then uses this estimated location and the one or more known values to assist in decoding. FIG. 7 may comprise a set of computer readable instructions stored on or accessible by the second correspondent device 154.

First, in step 302, the second correspondent device 154 retrieves from the memory 162 at least one of the one or more known values. Next, in step 304, the second correspondent device 154 uses the module 164 and the known value(s) retrieved from the memory 162 to apply a statistical measure to estimate the location of the component in the received data corresponding to the one or more known values. Specifically, the statistical measure comprises searching for a sequence of data in the received data sufficiently close to the known component. As an example, the statistical measure can be a sliding correlation. The statistical measure may be applied in real-time as the data is received by the second correspondent device 154, or after the complete block of data corresponding to the encoded message m is received. If the statistical measure is sliding correlation, the sliding correlation may comprise soft sliding correlation or hard sliding correlation depending on the format of the data.

Next, in step 306, the estimated location calculated in step 304 is used by the decoder 160 to assist in decoding. This can be done a number of different ways. In the simplest approach, the decoder 160 assumes the estimated location of the component in the received data corresponding to the one or, more values known a priori is the actual location of the component. The decoder 160 then simply deletes this component from the received data and replaces it with the known values, thereby eliminating any errors in the known component that may have been introduced during transmission. This can be done before or after application of the decoding algorithm. As another example, if the decoder 160 is a trellis-based decoder, the decoder 160 can use the known values and the estimated location to set one or more states in the trellis-based decoding algorithm.

It will be appreciated that the technique described with reference to FIG. 7 can be executed as necessary or as desired depending on the particular messages being transmitted, the ease with which re-transmission can be requested, and/or the amount of noise in the channel. For example, in an exemplary embodiment, the decoder 160 first decodes the received digital data without the estimated location or the known values. Then, if and only if an error detector (such as a CRC check) subsequently determines that a decoding error has occurred, the method of FIG. 7 is executed to re-attempt decoding, rather than simply discarding the message and/or requesting re-transmission.

Also, the statistical module 164 may generate a plurality of possible locations of the component in the received data corresponding to the known values. In this case, in one embodiment, if a decoding error is detected using the most likely estimated location, then step 306 is repeated using another possible location as the estimated location. This optional operation is shown in dotted lines as step 308 in FIG. 7. Step 308 is particularly advantageous if correct decoding of the transmitted message is important and/or if it is undesirable or not possible to request re-transmission of the message.

Finally, in the embodiment described with reference to FIGS. 6 and 7, the one or more values known a priori by the second correspondent device 154 are unencoded message symbols. However, it will be appreciated that the one or more values known a priori by the second correspondent device 154 and stored in the memory 162 can instead be the encoded version of the known message symbols.

Although the invention has been described with reference to certain specific embodiments, various modifications thereof will be apparent to those skilled in the art without departing from the spirit and scope of the invention as identified in the claims appended hereto.

What is claimed is:

1. A method for decoding digital data received by a correspondent device over a communication channel, the data including a component corresponding to a plurality of values unknown to the correspondent device and a component corresponding to at least one value known a priori by the correspondent device, at least one of the at least one value known a priori by the correspondent device being stored in memory of the correspondent device, the method comprising:
   (a) the correspondent device retrieving from memory the at least one of the one or more known values;
   (b) the correspondent device applying a statistical measure using the at least one of the at least one known value to generate a first estimated location of the component corresponding to the at least one known value, and at least one additional estimated location of the component corresponding to the at least one known value;
   (c) a decoder of the correspondent device using the at least one known value and the first estimated location of the component corresponding to the at least one known value in decoding the data by using the first estimated location of the component corresponding to the at least one known value as the actual location of the component corresponding to the at least one known value;
   (d) the correspondent device checking for an error in the decoded data; and
   (e) if the correspondent device detects an error in the data decoded in operation (d), then repeating operations (c) and (d) using each of the at least one additional estimated location of the component corresponding to the at least one known value, the repeating being performed until no decoding errors are found in a particular iteration, or until reaching a predetermined tolerable delay.

2. The method of claim 1 wherein prior to operation (a), the decoder first decodes the data without the first estimated location and without the at least one known value, and subsequently performs operations (a) to (c) only if a decoding error is detected.

3. The method of claim 1 wherein said statistical measure is a sliding correlation.

4. The method of claim 3 wherein the sliding correlation is applied in real-time as the data is received by the correspondent device.

5. The method of claim 3, wherein the sliding correlation is applied once the data has been received by the correspondent device.

6. The method of claim 3, wherein the sliding correlation generates a highest correlation measure corresponding to the first estimated location, and generates at least one additional correlation measure corresponding to the at least one additional estimated location.

7. The method of claim 6, wherein a plurality of additional estimated locations are ranked according to respective additional correlation measures, and operations (c) and (d) are repeated iteratively according to rankings.

8. The method of claim 1 wherein said decoding comprises trellis-based decoding, and wherein the at least one known value is used to set at least one state in a trellis-based decoding algorithm.

9. A non-transitory computer readable medium having stored thereon computer readable instructions for decoding digital data received by a correspondent device over a communication channel, the data including a component corresponding to a plurality of values unknown to the correspondent device and a component corresponding to at least one value known a priori by the correspondent device, at least one of the at least one value known a priori by the correspondent device being stored in memory of the correspondent device, the computer readable instructions comprising instructions for:
   (a) retrieving from memory the at least one of the one or more known values;
   (b) applying a statistical measure using the at least one of the at least one known value to generate a first estimated location of the component corresponding to the at least one known value, and at least one additional estimated location of the component corresponding to the at least one known value;
   (c) using the at least one known value and the first estimated location of the component corresponding to the at least one known value in decoding the data by using the first estimated location of the component corresponding to the at least one known value as the actual location of the component corresponding to the at least one known value;
   (d) checking for an error in the decoded data; and
   (e) if the correspondent device detects an error in the data decoded in operation (d), then repeating operations (c) and (d) using each of the at least one additional estimated location of the component corresponding to the at least one known value, the repeating being performed until no decoding errors are found in a particular iteration, or until reaching a predetermined tolerable delay.

10. The non-transitory computer readable medium of claim 9 wherein said computer readable instructions further comprise instructions for: prior to operation (a), the decoder first decoding the data without the first estimated location and without the at least one known value, and subsequently performing operations (a) to (c) only if a decoding error is detected.

11. The non-transitory computer readable medium of claim 9 wherein said statistical measure is a sliding correlation.

12. The non-transitory computer readable medium of claim 11 wherein the sliding correlation is applied in real-time as the data is received by the correspondent device.

13. The non-transitory computer readable medium of claim 11, wherein the sliding correlation is applied once the data has been received by the correspondent device.

14. The non-transitory computer readable medium of claim 13, wherein a plurality of additional estimated locations are ranked according to respective additional correlation measures, and operations (c) and (d) are repeated iteratively according to rankings.

15. The non-transitory computer readable medium of claim 11, wherein the sliding correlation generates a highest correlation measure corresponding to the first estimated location, and generates at least one additional correlation measure corresponding to the at least one additional estimated location.

16. The non-transitory computer readable medium of claim 9 wherein said decoding comprises trellis-based decoding, and wherein the at least one known value is used to set at least one state in a trellis-based decoding algorithm.

17. A correspondent device in a communication system configured to decode digital data received over a communication channel in the communication system, the data including a component corresponding to a plurality of values unknown to the correspondent device and a component corresponding to at least one value known a priori by the correspondent device, the correspondent device comprising:
   a processor;
   a memory for storing at least one of the at least one value known a priori by the correspondent device; and
   computer executable instructions executable by the processor to:
   (a) retrieve from the memory, the at least one of the at least one known value;
   (b) apply a statistical measure using the at least one of the at least one known value to generate a first estimated location of the component corresponding to the at least one known value, and at least one additional estimated location of the component corresponding to the at least one known value;
   (c) use the at least one known value and the first estimated location of the component corresponding to the at least one known value in decoding the data by using the first estimated location of the component corresponding to the at least one known value as the actual location of the component corresponding to the at least one known value;
   (d) check for an error in the decoded data; and
   (e) if the correspondent device detects an error in the data decoded in operation (d), then repeat operations (c) and (d) using each of the at least one additional estimated location of the component corresponding to the at least one known value, the repeating being performed until no decoding errors are found in a particular iteration, or until reaching a predetermined tolerable delay.

18. The correspondent device of claim 17 wherein the data is first decoded without the first estimated location and without the at least one known value, and subsequently performs operations (a) to (e) only if a decoding error is detected.

19. The correspondent device of claim 17 wherein the statistical measure is a sliding correlation.

20. The correspondent device of claim 19 wherein the sliding correlation is applied in real-time as the data is received by the correspondent device.

21. The correspondent device of claim 17, wherein the sliding correlation is applied once the data has been received by the correspondent device.

22. The correspondent device of claim 21, wherein a plurality of additional estimated locations are ranked according to respective additional correlation measures, and operations (c) and (d) are repeated iteratively according to rankings.

23. The correspondent device of claim 17, wherein the sliding correlation generates a highest correlation measure corresponding to the first estimated location, and generates at least one additional correlation measure corresponding to the at least one additional estimated location.

24. The correspondent device of claim 17 wherein said decoding comprises trellis-based decoding, and wherein the at least one known value is used to set at least one state in a trellis-based decoding algorithm.

* * * * *